United States Patent
Doetsch et al.

(10) Patent No.: US 6,771,937 B2
(45) Date of Patent: Aug. 3, 2004

(54) FREQUENCY-STABILIZED TRANSMITTING/ RECEIVING CONFIGURATION

(75) Inventors: Markus Doetsch, Schliern (CH); Peter Jung, Otterberg (DE); Jörg Plechinger, München (DE); Peter Schmidt, Erpolzheim (DE)

(73) Assignee: Infineon Technologies AG, Munich (DE)

(*) Notice: Subject to any disclaimer, the term of this patent is extended or adjusted under 35 U.S.C. 154(b) by 605 days.

(21) Appl. No.: 09/864,977

(22) Filed: May 24, 2001

(65) Prior Publication Data

US 2002/0013131 A1 Jan. 31, 2002

Related U.S. Application Data

(63) Continuation of application No. PCT/DE99/03715, filed on Nov. 23, 1999.

(30) Foreign Application Priority Data

Nov. 24, 1998 (DE) .......................... 198 54 167

(51) Int. Cl.[7] .......................... H04B 7/00; H04B 1/18; H04L 27/06
(52) U.S. Cl. .......................... 455/71; 455/70; 455/131; 455/192.1; 455/192.2; 375/344
(58) Field of Search .......................... 455/67.16, 69, 455/70, 71, 561, 131, 139, 138, 192.1, 192.2, 164.1, 164.2; 375/344, 345, 350

(56) References Cited

U.S. PATENT DOCUMENTS

| | | | |
|---|---|---|---|
| 5,241,688 A | | 8/1993 | Arora |
| 5,422,917 A | * | 6/1995 | Scott .......................... 375/371 |
| 5,423,085 A | * | 6/1995 | Lim .......................... 455/264 |
| 5,434,889 A | * | 7/1995 | Baier .......................... 375/344 |
| 5,594,757 A | * | 1/1997 | Rohani .......................... 375/344 |
| 5,640,431 A | * | 6/1997 | Bruckert et al. .......................... 375/344 |
| 5,684,836 A | * | 11/1997 | Nagayasu et al. .......................... 375/326 |
| 5,802,117 A | * | 9/1998 | Ghosh .......................... 375/344 |
| 5,983,077 A | * | 11/1999 | Dent .......................... 455/44 |
| 6,097,770 A | * | 8/2000 | Bahai et al. .......................... 375/344 |
| 6,104,767 A | * | 8/2000 | Atarius et al. .......................... 375/344 |
| 6,347,126 B1 | * | 2/2002 | Nagayasu et al. .......................... 375/344 |
| 6,393,068 B1 | * | 5/2002 | Rupp .......................... 375/326 |

FOREIGN PATENT DOCUMENTS

| | | |
|---|---|---|
| DE | 40 13 384 A1 | 10/1991 |
| DE | 44 10 607 C1 | 3/1995 |
| DE | 44 10 608 C1 | 3/1995 |
| DE | 195 16 449 A1 | 11/1996 |
| DE | 196 05 704 A1 | 8/1997 |

OTHER PUBLICATIONS

Charbit, G. et al.: "Frame Synchronisation and Frequency–Carrier Estimation for GSM Mobile Communications.", EPMCC'97, Second European Peronal Mobile Communications Conference–zusammen mit 3. ITG–Fachtagung, Mobile Kommunikation, Bonn, Germany, Sep. 30th–Oct. 2nd, 1997, vol. 145, No. 145, Sep. 30th, 1997, pp. 449–457, XP002100275, Bonn, Germany.

* cited by examiner

Primary Examiner—William Trost
Assistant Examiner—Meless Zewdu
(74) Attorney, Agent, or Firm—Laurence A. Greenberg; Werner H. Stemer; Ralph E. Locher

(57) ABSTRACT

A circuit configuration has a radio-frequency section with a receiving mixing stage, and has a signal processing circuit with an A/D converter, a digital filter and a frequency estimator. The frequency estimator continuously determines a first frequency correction control signal, which is representative of a frequency offset between the frequency of an IF received signal and a frequency which is characteristic of a pass band of the filter. The first frequency correction control signal is used for readjustment of the mixing frequency.

11 Claims, 2 Drawing Sheets

FREQUENCY-STABILIZED TRANSMITTING/RECEIVING CONFIGURATION

CROSS-REFERENCE TO RELATED APPLICATION

This application is a continuation of copending International Application No. PCT/DE99/03715, filed Nov. 23, 1999, which designated the United States.

BACKGROUND OF THE INVENTION

FIELD OF THE INVENTION

The invention lies in the electronics field. More specifically, the invention relates to frequency-stabilized circuit configurations, in particular to a transmitting/receiving configuration with a high-frequency section with a reception mixing stage, which receives an RF received signal and converts the RF received signal to an analog IF received signal by down-mixing with an adjustable mixing frequency, and a signal processing circuit. The latter includes an A/D converter which converts the analog IF received signal to a digital received signal, a digital filter which is connected downstream of the A/D converter and emits a filtered digital received signal, and a frequency estimator which receives the filtered digital received signal. Circuit configurations of this type are used in communications terminals (base station and mobile station) in mobile communications systems.

In practice, only a tightly constrained bandwidth range is generally available for the transmission of messages. In order to allow as many messages as possible to be transmitted, it is necessary to utilize the available bandwidth range as efficiently as possible. Firstly, multiple access methods such as time-division multiplex (TDMA, time division multiple access), frequency division multiplex (FDMA, frequency division multiple access), code division multiplex (CDMA, code division multiple access), and space division multiplex (SDMA, space division multiple access), as well as combinations of the multiple access methods allow flexible, requirement-oriented utilization of the available bandwidth. Secondly, best-possible utilization of the available bandwidth range must also be ensured in the hardware.

In mobile radio technology, the available total bandwidth is subdivided into traffic channels with a predetermined channel bandwidth, with a subscriber being assigned a specific traffic channel when dialing into the mobile radio network. The radio-frequency section of the mobile communications terminal (referred to as the mobile station from here on) is tuned to the assigned channel (mid-)frequency by means of the reception mixing stage, and signal components which are outside the channel bandwidth range are removed from the received signal by means of suitable filters (bandpass filters or low-pass filters) in the intermediate frequency (IF) or baseband range.

There is a risk during filtering, that frequency regions of the received signal in which information is carried may be filtered out inadvertently. The reasons for this are as follows:

When the mobile station is moving relative to the stationary base station, the Doppler effect results in a frequency shift between the RF received signal received by the mobile station and the radio signal transmitted by the base station at the predetermined channel frequency. This Doppler frequency shift is transferred by the down-mixing process to the analog IF received signal and to the digital received signal, where it results in a mismatch between these signals and the spectral pass band of the downstream filter.

Furthermore, slow drifts and rapid time fluctuations in the mixing frequency used for down-mixing the RF received signal in the reception mixing stage contribute to undesirable signal losses. Such drifts and fluctuations in the mixing frequency are caused by temperature drifts and phase noise in the oscillator that is used.

It has already been known from the prior art for frequency correction bursts (FCB) to be transmitted at regular time intervals in the radio signal transmitted by the base station. The FCB is searched for in the radio-frequency section of the mobile station using a frequency pattern with a pattern width of, for example, 20 kHz. The FCB can be determined to the accuracy of the pattern width by tuning to that pattern frequency which has the maximum FCB received signal strength. The mixing frequency is then readjusted as a function of the determined pattern frequency. This makes it possible to compensate for relatively slow frequency shifts caused by the Doppler effect and drifts in the mixing frequency.

It has already been known for oscillators with low phase noise to be used in order to reduce rapid frequency fluctuations. However, these have the disadvantage that low-noise oscillators are relatively expensive.

U.S. Pat. No. 5,241,688 describes a circuit for frequency synchronization of a mobile radio receiver. On detection of an FCB, an I/Q decoder in the digital signal processing section of the mobile radio receiver produces a control signal, which is supplied to a local oscillator where it compensates for the frequency offset. This control signal is produced in the I/Q decoder by estimating the signal energy downstream from adaptive bandpass filtering.

SUMMARY OF THE INVENTION

The object of the present invention is to provide a circuit configuration which overcomes the above-noted deficiencies and disadvantages of the prior art devices and methods of this general kind, and which is suitable for use in a communications terminal, can be produced economically, and allows good spectral utilization of a traffic channel with a predetermined bandwidth.

With the above and other objects in view there is provided, in accordance with the invention, a circuit configuration, comprising:

a radio-frequency section having a reception mixing stage configured to receive an RF received signal and to convert the RF received signal to an analog IF received signal by down-mixing with an adjustable mixing frequency; and a signal processing circuit connected to the radio-frequency section and having
an A/D converter for converting the analog IF received signal to a digital received signal;
a digital filter connected to receive the digital received signal from the A/D converter, the digital filter having a given pass band and outputting a filtered digital received signal;
a channel estimator for estimating a transfer function of a radio channel connected to the digital filter; and
a frequency estimator contained in the channel estimator and connected to receive the filtered digital received signal from the digital filter, the frequency estimator continuously determining a first frequency correction control signal representative of a frequency offset between a frequency of the analog IF received signal and a frequency characteristic of the pass band of the digital filter, and the frequency estimator outputting the first frequency correction control signal for readjusting the mixing frequency in the radio-frequency section.

In other words, the first frequency correction control signal, which is required for readjustment of the mixing frequency, is not generated, as is normally done in the prior art, in the radio-frequency section, but is determined by calculation in the frequency estimator.

The frequency estimator is implemented in the channel estimator. The invention is thus dependent only on appropriate programming of the channel estimator (which is required in any case for mobile radio applications), and can thus be implemented economically and in a hardware-efficient manner in the circuit configuration.

The reception mixing stage can down-mix to a frequency range at a reduced frequency, or else directly to baseband (direct down-conversion). The term IF frequency used herein is intended to refer to any frequency below the carrier frequency, including baseband.

The circuit configuration is preferably designed not only as a receiver but also as a transmitter. The signal processing circuit then, furthermore, has a digital modulator and a D/A converter, and the radio-frequency section is equipped with a transmission mixing stage. An analog transmission signal which is produced by the digital modulator and is emitted by the D/A converter is supplied to the radio-frequency section and is converted in the transmission mixing stage, by up-mixing, to an RF transmission signal, using a further mixing frequency which is set as a function of the first frequency correction control signal. The advantages stated with respect to the receiving section of the circuit configuration according to the invention apply equally to the transmission section.

In accordance with an added feature of the invention, the signal processing circuit further includes a digital modulator and a D/A converter;

the radio-frequency section has a transmission mixing stage; and an analog transmission signal produced by the digital modulator and output by the D/A converter, is supplied to the radio frequency section and is converted to an RF transmission signal in the transmission mixing stage by up-mixing with a further mixing frequency set in dependence on the first frequency correction control signal.

In accordance with an additional feature of the invention, there is provided an oscillator having a controllable oscillator frequency, the oscillator receiving the first frequency correction control signal for controlling the oscillator frequency, and wherein at least one of the mixing frequency and the further mixing frequency is derived from the controlled oscillator frequency. In other words, the mixing frequency and/or the further mixing frequency is derived from the oscillator frequency.

In accordance with another feature of the invention, a radio received signal, transmitted by a base station, contains a cyclically recurring frequency correction burst signal component, in the form of a sinusoidal oscillation; and the frequency estimator estimates the frequency offset by evaluating a signal component of the filtered digital received signal, on which the frequency correction burst signal component of the radio received signal is based. In order, therefore, to determine the frequency offset, a radio signal transmitted by a base station preferably contains a frequency correction burst signal component (FCB), which recurs cyclically, in the form of a sinusoidal oscillation, and the frequency estimator estimates the frequency offset from an evaluation of a signal component of the filtered digital received signal, on which the frequency correction burst signal component (FCB) of the radio signal is based.

The frequency correction burst signal component (FCB) is preferably transmitted by the base station every 10 to 100 ms. The first frequency correction control signal can then be determined at the same rate, that is to say likewise every 10 to 100 ms. This rate is sufficient to correct slow frequency shifts, such as those which result from drift of the oscillator crystal as a result of temperature changes.

With the above and other objects in view there is also provided, in accordance with the invention, a circuit configuration, comprising:

a radio-frequency section with a reception mixing stage connected to receive an RF received signal and converting the RF received signal by downmixing to an analog IF received signal; and a signal processing circuit having an A/D converter converting the analog IF received signal to a digital received signal;

a digital filter connected downstream of the A/D converter, the digital filter having a given pass band, and outputting a filtered digital received signal; and a frequency estimator connected to receive the filtered digital received signal, the frequency estimator continuously determining a second frequency correction control signal representative of a frequency offset between a frequency of the analog IF received signal and a frequency characteristic of the pass band of the digital filter; and wherein the second frequency correction control signal is used for at least one of a spectral reprocessing of the digital received signal upstream of the digital filter and a readjustment of the pass band of the digital filter.

Similarly to the configuration summarized above, a (second) frequency correction control signal is also determined here by calculation in the frequency estimator, and this signal is representative of the frequency offset between the analog IF received signal and a frequency that is characteristic of the pass band of the digital filter. In contrast to the situation in the first-outlined solution, the second frequency correction control signal is, however, not used for readjustment of the mixing frequency, but either for spectral reprocessing of the digital received signal upstream of the digital filter, or for readjustment of the pass band of the digital filter.

In this solution as well, the measures according to the invention are carried out by calculation, without any need for additional complexity in the hardware area.

The circuit configuration is preferably likewise equipped with further circuit devices for transmitting a radio signal. In this case, the signal processing circuit furthermore has a digital modulator and a D/A converter, with a modulated digital transmission signal, which is provided by the digital modulator, then converted by the D/A converter to an analog transmission signal. The second frequency correction control signal is supplied to the digital modulator, with the digital modulator changing the frequency of the modulated digital transmission signal as a function of the second frequency correction control signal.

According to one preferred embodiment of the invention, the frequency estimator uses the moment calculation method in order to estimate the frequency offset. It has been found that this method allows the frequency offset to be determined particularly accurately and with little complexity.

The invention can provide for the frequency estimator to in each case redetermine the second frequency correction control signal for each of the data symbols in the filtered digital received signal. This determination of the second frequency correction control signal symbol-by-symbol results in the best possible time resolution. High time resolution allows effective correction for rapid frequency fluctuations which are caused by phase noise in the oscillator.

Other features which are considered as characteristic for the invention are set forth in the appended claims.

Although the invention is illustrated and described herein as embodied in a frequency stabilized transmitting/receiving configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
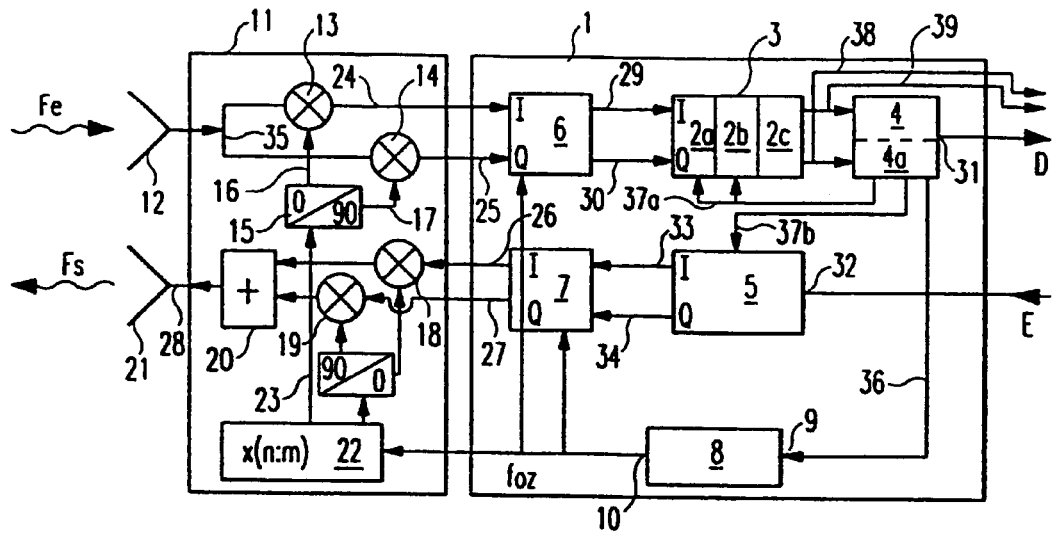
FIG. 1 is a schematic block circuit diagram of a circuit configuration according to the invention.

Referring now to the figures of the drawing in detail and first, particularly, to FIG. 1 thereof, there is seen a circuit configuration which is intended for a communications terminal, for example a mobile station. The circuit has a radio-frequency section 11 and a signal processing circuit 1.

The radio-frequency section 11 has a receiving antenna 12 which receives a radio received signal Fe which has previously been transmitted by a stationary base station in a predetermined frequency channel with a channel mid-frequency $f_K$.

An RF received signal 35 emitted from the receiving antenna 12 is supplied to a first and a second down-mixer 13, 14. The down-mixers 13, 14 are operated with mixing frequency signals 16, 17, which have the same mixing frequency $f_M$ and a phase shift of 90° with respect to one another.

An oscillator 8 (VCO: voltage-controlled oscillator) with a controllable oscillator frequency $f_{Oz}$ is provided in the signal processing circuit in order to produce the mixing frequency signals 16, 17. The oscillator frequency $f_{Oz}$ may, for example, be 13 MHz, and is produced at an output 10 of the VCO 8. The oscillator frequency $f_{Oz}$ is supplied to an n:m frequency multiplier 22, which produces a mixing frequency signal 23 at n:m times the frequency $f_M$, where n, m are integers. The mixing frequency signal 23 is supplied to a 90° phase shifter 15, which produces the two mixing frequency signals 16, 17, phase shifted through 90° with respect to one another.

The down-mixers 13, 14 each produce an analog IF received signal 24 or 25, respectively, and these are supplied to an I (in-phase) input and a Q (quadrature) input of an A/D converter 6.

The A/D converter 6 samples each of the two analog IF received signals 24, 25 separately at a sampling frequency $F^A$ derived from the oscillator frequency $f_{Oz}$, and produces respective digital received signals 29, 30 at its outputs. An oversampling method with $f_A = 2L \cdot f_{KB}$ can be used to improve the conversion accuracy, where $f_{KB}$ is the channel bandwidth and L>1 is the chosen oversampling factor.

The digital received signals 29, 30 are supplied to I and Q inputs of a digital multirate circuit 3.

The multirate circuit 3 may have a frequency shift calculator 2a, a digital filter 2b and a sampling frequency reducer 2c.

The frequency shift calculator 2a makes it possible to calculate any frequency shift in the spectra of the incoming digital received signals 29, 30.

The digital filter 2b carries out bandwidth limiting (likewise by calculation) on the digital received signals 29, 30 whose frequency may have previously been shifted. For this purpose, the digital filter 2b has a pass band with a fixed predetermined pass bandwidth $f_{FB}$. If this is a bandpass filter, the pass band with a fixed bandwidth $f_{FB}$ can be shifted spectrally, as will be explained in more detail further below. The digital filter 2b may be, for example, a first or higher order finite impulse response (FIR) or infinite impulse response (IIR) bandpass or—in baseband—low-pass filter.

The sampling frequency reducer 2c is connected downstream from the digital filter 2b and, if necessary, reduces the sampling frequency by a suitable factor L'. The sampling frequency reducer 2c is used to produce the filtered digital received signals 38, 39, which are emitted from the multirate circuit 3, on the output side at a sampling frequency, which is matched to the requirements that exist for the downstream data processing in terms of computation complexity and computation accuracy.

The multirate circuit 3 has a data link on the output side to a channel estimator 4. A frequency estimator 4a is implemented in the form of software in the channel estimator 4.

The object of the channel estimator 4 is, firstly, to use predetermined data sequences (training sequences) contained in the radio received signal Fe to continuously determine up-to-date channel parameters (impulse responses) and, on the basis of them, an up-to-date transfer function for the mobile radio channel. The transfer function characterizes the instantaneous transmission response of the mobile radio channel. It needs to be continuously redetermined, since the wave propagation in the air interface of the mobile radio channel changes all the time owing to changing environmental influences, which means that data detection is impossible unless the associated transfer function is known.

The data detection is carried out in a data detector D. For this purpose, the data detector D is provided with the filtered digital received signal 38, 39 emitted from the multirate circuit 3 and, via an output 31 of the channel estimator 4, with the associated up-to-date transfer function.

Secondly, the channel estimator 4 uses the integrated frequency estimator 4a (or software which represents the frequency estimator 4a) in the manner according to the invention to determine a first frequency correction control signal 36 and two second frequency correction control signals 37a, 37b. The first frequency correction control signal 36 is supplied to a frequency control input 9 of the VCO 8 in order to control the oscillator frequency $f_{Oz}$. One of the two second frequency correction control signals 37a is supplied to the frequency shift calculator 2a and/or to the digital filter 2b of the multirate circuit 3. The other second frequency correction control signal 37b is fed to a digital I/Q modulator 5, which is accommodated in the transmission section, which will be described further below, of the circuit configuration according to the invention.

The digital I/Q modulator 5 is supplied via an input 32 with a digital input signal E, which may previously have been source-coded, channel-coded and interleaved. The digital I/Q modulator 5 keys the digital input signal E using a predetermined modulation method, for example GMSK (Gaussian minimum shift keying), with bandwidth limiting being carried out at the same time. On the output side, the I/Q modulator 5 provides a D/A converter 7 with two keyed (modulated) digital input signals 33, 34 (I branch and Q branch). The D/A converter 7 converts the digital input signals 33, 34 to an analog I output signal 26 and to an analog Q output signal 27.

The RF transmission stage is designed analogously to the RF reception stage. The two analog I/Q output signals 26, 27 are supplied to two up-mixers 18, 19, which are actuated with a 90° phase-offset and are each operated at a mixing frequency $f_M$. The mixing frequency $f_M$ is produced by the n:m frequency multiplier 22. The output signals from the up-mixers 18, 19 are supplied to an adder stage 20, where an RF transmission signal 28 is heterodyned with them. The RF transmission signal 28 is transmitted as a radio transmission signal Fs by means of a transmitting antenna 21.

Figure 2:
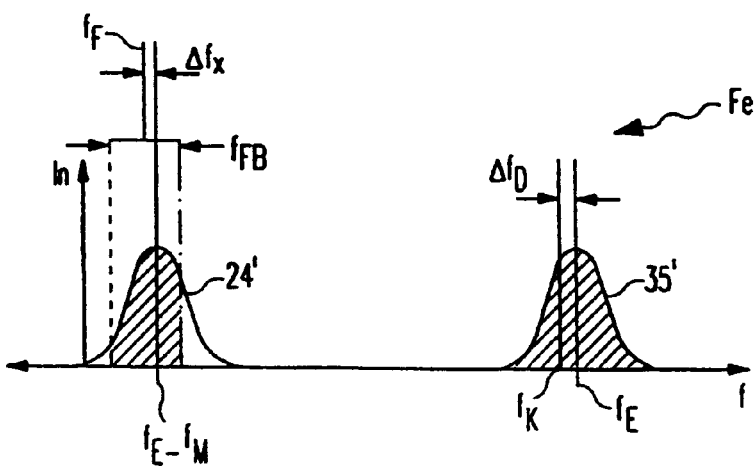
FIG. 2 is a schematic graph showing the frequency spectra of an RF received signal and of an IF received signal produced from it by down-mixing.

FIG. 2 shows a diagram illustrating a spectrum 35' of the RF received signal 35 and a spectrum 24' of the down-mixed analog IF received signal 24, in a qualitative manner.

The radio received signal Fe is transmitted by the base station in a subscriber channel with the channel mid-frequency $f_K$. In the situation being considered here, the mobile station is moving toward the base station, as a result of which the mid-frequency $f_E$ of the RF received signal spectrum 35' is shifted toward higher frequencies by the corresponding Doppler frequency shift $\Delta f_D$, with respect to the channel mid-frequency $f_K$.

The following analysis is based on the assumption that the digital filter 2 is a symmetrical bandpass filter with a pass mid-frequency $f_F$ and a fixed pass bandwidth $f_{FB}$, and the frequency shift calculator 2a does not shift the frequency of the digital received signals 29 and 30. Mixing the frequency $f_M$ with the mixing frequency signal 23 (or else 16, 17) produces an IF received signal 24 with a mid-frequency $f_E-f_M$. FIG. 2 shows the situation where $f_M=f_K-f_F$, that is to say without considering the Doppler frequency shift $\Delta f_D$ during the down-mixing process. The mid-frequency of the signal spectrum 24' is then shifted toward higher frequencies by a frequency offset $\Delta f_X = \Delta f_D$ with respect to the pass mid-frequency $f_F$ of the digital filter 2.

That spectral component of the IF received signal 24 which is located in the pass band (bandwidth $F_{FB}$) of the digital filter 2 is illustrated shaded in FIG. 2. It can clearly be seen that the mismatch between $f_F$ and $f_E-f_M$ results in the bandwidth utilization being poorer and, as a consequence of this and in a disadvantageous manner, in a reduction in the signal-to-noise ratio.

In the above text, it was assumed that $\Delta f_X = \Delta f_D$, that is to say that the Doppler frequency shift $\Delta f_D$ is the sole cause of the mismatch between the spectrum 24' of the IF received signal 24 and the pass mid-frequency $f_F$ of the digital filter 2. However, in general, $\Delta f_X \neq \Delta f_D$, since, in addition to the Doppler frequency shift $\Delta f_D$ other influences such as (slow) frequency drifts and (rapid) frequency fluctuations of the VCO 8 (that is to say of the oscillator frequency $f_{Oz}$) also contribute to the frequency offset $\Delta f_X$.

While slow frequency drifts of the oscillator frequency $f_{Oz}$ and of that portion of the frequency offset $\Delta f_X$ which is caused by the Doppler frequency shift $\Delta f_D$ can be corrected by the first frequency correction control signal 36, the two second frequency correction control signals 37a, 37b make it possible to correct for rapid frequency fluctuations in the oscillator frequency $f_{Oz}$.

The frequency offset $\Delta f_X$ which needs to be determined in the frequency estimator 4a for both frequency correction control signals 36 and 37a, 37b can, for example, be estimated using the moment calculation method. This method is explained in more detail in the following text:

Let us consider N discrete complex values of a received sequence $\vec{e} = (\underline{e}_1, \underline{e}_2, \ldots, \underline{e}_N)$ of the filtered digital received signal 38 or 39.

The normalized frequency $\tilde{f}$ is defined by the expression $$\tilde{f} = f \cdot \frac{T_b}{N} \quad (1)$$

where f corresponds to the frequency $f_K-f_M$, illustrated in FIG. 2, of the down-mixed IF received signal 24, and $T_b$ is the observation time (that is to say the time over which the N values $\underline{e}_n$ are gathered).

Each value $\underline{e}_n$ in the received sequence $\underline{e}=(\underline{e}_1, \underline{e}_2, \ldots, \underline{e}_N)$ can be expressed by the equation $$\underline{e}_n = A_n \cdot \exp(j\varphi_0) \cdot \exp(j 2\pi \tilde{f} n) + \underline{n}_n \quad (2)$$

In this case, $A_n \cdot \exp(j\phi_0)$ denotes the complex amplitude and $\underline{n}_n$ denotes a noise component of $\underline{e}_n$ caused by white noise with the Gaussian width $\sigma$.

The useful signal contained in the received sequence $\vec{e}$ is written as useful signal sequence $$\vec{s} = (\underline{s}_1, \underline{s}_2, \ldots, \underline{s}_N) \text{ with } \underline{s}_n = A_n \cdot \exp(j\varphi_0) \cdot \exp(j 2\pi \tilde{f} n) \quad (3)$$

The autocorrelation function of the useful signal is given by $$r_{s_{nk}} = E\{\underline{s}_n \cdot \underline{s}_{n+k}^*\} \quad (4)$$
$$= E\{A_n \cdot A_{n+k}\} \cdot \exp(-j 2\pi \tilde{f} k)$$

where $$E\{\underline{s}_n \cdot \underline{s}_{n+k}^*\}$$

is the expected value of the product of the values of $\underline{s}_n$ and $\underline{s}_{n+k}^*$, which are in the form of random variables (complex-conjugate expressions are denoted by a *)

The autocorrelation function of the filtered digital received signal 38, 39 is in the form:

$$r_{\varepsilon_{nk}} = E\{A_n \cdot A_{n+k}\} \cdot \exp(-j2\pi \tilde{f} k) + \sigma^2 \cdot \delta_{nk}. \quad (5)$$

If k=1, then $$r_{\varepsilon_{nl}} = \exp(-j2\pi \tilde{f}) \cdot E\{A_n \cdot A_{n+1}\} \quad (6)$$
$$= \{\cos(2\pi \tilde{f}) - j\sin(2\pi \tilde{f})\} \cdot E\{A_n \cdot A_{n+1}\}$$

With the abbreviation $$\tilde{f} = \frac{1}{4\pi} \cdot \left\{ \arccos\left(\frac{\mathrm{Re}\{r_{\varepsilon_{nl}}\}}{\sigma_A^2}\right) - \arcsin\left(\frac{\mathrm{Im}\{r_{\varepsilon_{nl}}\}}{\sigma_A^2}\right) \right\} \quad (7)$$

it follows that $$\sigma_A^2 = E\{A_n \cdot A_{n+1}\}$$

A good estimate for the autocorrelation function is:

$$\hat{r}_{\varepsilon_{nl}} \approx \frac{1}{N-1} \sum_{n=1}^{N-1} \underline{e}_n \cdot \underline{e}_{n+1}^* \quad (8)$$

Substituting (8) in (7) leads to:

$$\hat{\tilde{f}} = -\frac{1}{2\pi} \cdot \arctan\left\{ \frac{\mathrm{Im}\left\{\frac{1}{N-1}\sum_{n=1}^{N-1} \underline{e}_n \cdot \underline{e}_{n+1}^*\right\}}{\mathrm{Re}\left\{\frac{1}{N-1}\sum_{n=1}^{N-1} \underline{e}_n \cdot \underline{e}_{n+1}^*\right\}} \right\} \quad (9)$$

In this case, $\hat{\tilde{f}}$ is an estimated value, obtained from N values of the received sequence $\vec{e}$, for the normalized frequency $\tilde{f}$. According to equation (1), $\hat{f}$ results in an estimated value $\hat{f}$ of the frequency f, and the estimated value $\hat{f}$ results in an estimated value $\Delta\hat{f}_x$ for the frequency offset $\Delta f_x$.

In order to calculate the first and second frequency correction control signals 36 and 37a, 37b, $\hat{\tilde{f}}$ and thus also $\Delta\hat{f}_x$ are determined using different repetition rates and for different N. This will be explained in the following text with reference to FIGS. 3 and 4.

Figure 3:
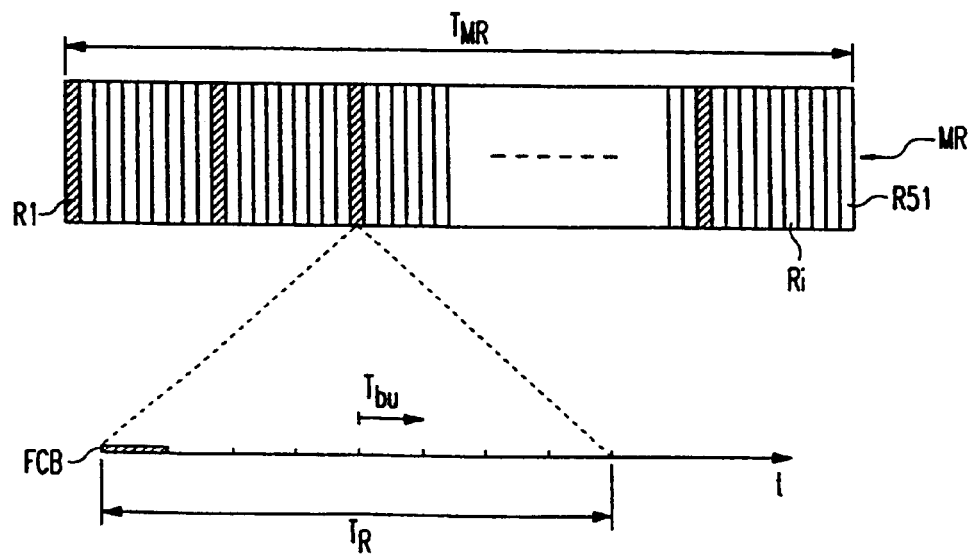
FIG. 3 is a schematic illustration of the structure of a superframe.

FIG. 3 shows a superframe MR, which is used in the GSM Standard as the largest possible unit for the structuring of data symbols. The superframe MR comprises 51 TDMA frames R1, ... R51, which are numbered successively in the superframe MR in ascending order from 1 to 51. Each TDMA frame Ri, i=1, ... 51 has a frame duration $T_R$=4.61 ms. In consequence, the duration of the superframe MR is approximately $T_{MR}$=235 ms.

Each TDMA frame Ri is subdivided into eight timeslots of duration $T_{bu}$. The timeslots are each assigned to different subscribers. A maximum of eight subscribers can thus interchange data with a common base station in one traffic channel.

A burst comprising (approximately) 156 symbols (bits) is transmitted in each timeslot.

There are a number of types of bursts, which differ by having a different symbol structure. One of these bursts is the frequency correction burst FCB. The FCB is in each case transmitted in the first timeslot of the TDMA frames R1, R11, R21, R31 and R41 and has the special feature that all the symbols have the logic value 0. The transmitted signal is in consequence a pure sinusoidal oscillation at a fixed frequency (which, for reasons which are not of any further importance to the present invention, is not precisely in the channel mid-frequency $f_K$, but is shifted from this by a fixed frequency shift of 1625 kHz/24=67.7 kHz).

It follows from what has been stated above that the FCB is transmitted approximately every 46 ms. Whenever an FCB is received, the frequency estimator 4a determines an estimated value $\Delta\hat{f}_x$ for the actual frequency offset $\Delta f_x$, and then produces the first frequency correction control signal 36. According to the invention, the mixing frequency $f_M$ is set by applying the first frequency correction control signal 36 to the VCO 8 such that the mid-frequency of the spectrum 24' of the analog IF input signal 24 coincides with the mid-frequency $f_F$ of the pass band of the filter 2, that is to say $\Delta\hat{f}_x$=($f_E$–$f_M$)–$f_F$=0. Slow frequency changes are thus regulated out.

Figure 4:
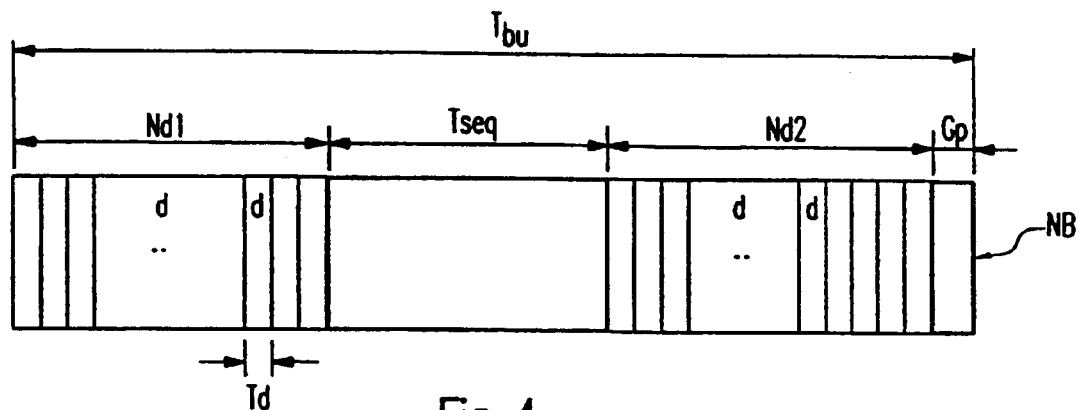
FIG. 4 is a schematic illustration of the structure of a data block.

FIG. 4 shows the structure of a message burst NB, as is used for transmitting message data. The message burst NB is formed essentially from a first message data section Nd1, a training sequency Tseq, a second message data section Nd2 and a guard time Gp. The training sequence Tseq is the same in each message burst NB and comprises 26 symbols. The symbol time duration $T_d$ is approximately 3.7 µs.

The training sequence Tseq is known to the channel estimator 4 and is used by it, as already described, to determine the transfer function of the mobile radio channel. A new transfer function is estimated for each message burst NB.

Furthermore, the channel estimator 4 uses the integrated frequency estimator 4a in a manner according to the invention to continuously determine the second frequency correction control signals 37a, 37b, which are representative of the instantaneous frequency offset $\Delta f_x$ between the spectral mid-frequency $f_E$–$f_M$ of the analog IF received signals 24, 25 and the mid-frequency $f_F$ of the pass band of the digital filter 2.

The second frequency correction control signals 37a, 37b can be determined burst-by-burst, that is to say at the same rate (approximately every 4.6 ms) as the determination of the transfer function. In this case, the estimation of the frequency offset $\Delta f_x$ (by calculation of $\Delta\hat{f}_x$) can be based on the training sequence Tseq, in precisely the same way as the determination of the channel transfer function.

However, it is also possible to provide a considerably higher rate for the determination of the second frequency correction control signals 37a, 37b. The highest possible time resolution is achieved for symbol-based determination, in which the second frequency correction control signals 37a, 37b are determined once again for each symbol time duration $T_d$—that is to say $\Delta\hat{f}_x$ is recalculated in each case. In order to achieve sufficient accuracy in the estimate of the frequency offset $\Delta f_x$, a sufficiently large number N of values of the received sequence $\vec{e}$ must then be available within the symbol time duration $T_d$. This means that it is necessary to ensure that the oversampling of the IF received signals 24, 25 in the A/D converter 6 is sufficiently high (high oversampling factor L), and that this sampling rate must not be significantly reduced in the downstream sampling rate reducer 2c (that is to say, for example, a factor L'=1).

Rapid frequency fluctuations (that is to say phase noise) in the VCO 8 are regulated out by means of the second frequency correction control signals 37a, 37b, since the described regulation process via the first frequency control correction signal 36 (for example approximately every 46 ms) is too slow. Fluctuations in the oscillator frequency $f_{Oz}$ occur in the time period around approximately 100 oscillator cycles. For an oscillator frequency $f_{Oz}$=13 MHz, the typical time duration for one fluctuation is, for example, approximately 8 μs, and is thus longer than the symbol time duration $T_d$.

The frequency fluctuations in the receiving section of the mobile station can be regulated out in two different ways: firstly by means of the frequency shift calculator 2a, using which the frequency of the digital received signals 29, 30 can be set to the mid-frequency $f_F$ of the digital filter 2b. Another, equivalent, option, without any previous frequency shifting of the digital received signals 29, 30, is to readjust the mid-frequency $f_F$ of the digital filter 2b continuously to the frequency of the digital received signals 29, 30. If the filtering by the digital filter 2 is carried out in baseband, that is to say the digital filter 2 is in the form of a low-pass filter, the frequency offset $\Delta f_x$ can be corrected only by using the first option.

The noted effects (Doppler frequency shift $\Delta f_D$, frequency drifts and frequency fluctuations of the VCO 8) likewise need to be taken into account at the transmission end of the mobile station, since the radio transmission signal Fs is subjected in the base station to channel-limiting filtering, symmetrically with respect to the channel mid-frequency $f_K$. Accordingly, the mixing frequency $f_M$ needs to be corrected with respect to the nominal mixing frequency by means of the first frequency correction control signal 36, in an analogous manner to that in the reception stage. Furthermore, the rapid frequency fluctuations of the VCO 8 are corrected by means of the second frequency correction control signal 37b in the I/Q modulator 5, by means of an appropriate correction in the calculation (synthesization) of the digital modulated signals 33, 34.

We claim:

1. A circuit configuration, comprising:
   a radio-frequency section having a reception mixing stage configured to receive an RF received signal and to convert the RF received signal to an analog IF received signal by down-mixing with an adjustable mixing frequency; and
   a signal processing circuit connected to said radio-frequency section and having
      an A/D converter for converting the analog IF received signal to a digital received signal;
      a digital filter connected to receive the digital received signal from said A/D converter, said digital filter having a given pass band and outputting a filtered digital received signal;
      a channel estimator for estimating a transfer function of a radio channel connected to said digital filter; and
      a frequency estimator contained in said channel estimator and connected to receive the filtered digital received signal from said digital filter, said frequency estimator continuously determining a first frequency correction control signal representative of a frequency offset between a frequency of the analog IF received signal and a frequency characteristic of the pass band of said digital filter, and said frequency estimator outputting the first frequency correction control signal for readjusting the mixing frequency in said radio-frequency section.

2. The circuit configuration according to claim 1, wherein
   said signal processing circuit further includes a digital modulator and a D/A converter;
   said radio-frequency section has a transmission mixing stage; and
   an analog transmission signal produced by said digital modulator and output by said D/A converter, is supplied to said radio frequency section and is converted to an RF transmission signal in said transmission mixing stage by up-mixing with a further mixing frequency set in dependence on the first frequency correction control signal.

3. The circuit configuration according to claim 1, which further comprises an oscillator having a controllable oscillator frequency, said oscillator receiving the first frequency correction control signal for controlling the oscillator frequency, and wherein at least one of the mixing frequency and the further mixing frequency is derived from the controlled oscillator frequency.

4. The circuit configuration according to claim 1, wherein
   a radio received signal, transmitted by a base station, contains a cyclically recurring frequency correction burst signal component, in the form of a sinusoidal oscillation; and
   said frequency estimator estimates the frequency offset by evaluating a signal component of the filtered digital received signal, on which the frequency correction burst signal component of the radio received signal is based.

5. The circuit configuration according to claim 4, wherein the frequency correction burst signal component is transmitted by the base station every 10 to 100 ms.

6. A circuit configuration, comprising:
   a radio-frequency section with a reception mixing stage connected to receive an RF received signal and converting the RF received signal by downmixing to an analog IF received signal; and
   a signal processing circuit having
      an A/D converter converting the analog IF received signal to a digital received signal;
      a digital filter connected downstream of said A/D converter, said digital filter having a given pass band, and outputting a filtered digital received signal; and
      a frequency estimator connected to receive the filtered digital received signal, said frequency estimator continuously determining a second frequency correction control signal representative of a frequency offset between a frequency of the analog IF received signal and a frequency characteristic of the pass band of said digital filter; and
   wherein the second frequency correction control signal is used for at least one of a spectral reprocessing of the digital received signal upstream of said digital filter and a readjustment of the pass band of said digital filter.

7. The circuit configuration according to claim 6, wherein
   said signal processing circuit further has a digital modulator and a D/A converter, said D/A converter converting a modulated digital transmission signal provided by said digital modulator to an analog transmission signal;
   said digital modulator is connected to receive the second frequency correction control signal; and
   said digital modulator changes a frequency of the modulated digital transmission signal as a function of the second frequency correction control signal.

8. The circuit configuration according to claim 1, wherein said frequency estimator is configured to process a moment calculation for estimating the frequency offset.

9. The circuit configuration according to claim 6, wherein
   said signal processing circuit includes a channel estimator configured to estimate the transfer function of a radio channel; and said frequency estimator is contained in said channel estimator.

10. The circuit configuration according to claim 6, wherein said frequency estimator in each case redetermines the second frequency correction control signal for each data symbol in the filtered digital received signal.

11. The circuit configuration according to claim 6, wherein the filtered digital received signal is subdivided into bursts comprising a predetermined number of data symbols; and said frequency estimator in each case redetermines the second frequency correction control signal for each burst in the filtered digital received signal.

\* \* \* \* \*